(12) United States Patent
Lee et al.

(10) Patent No.: US 6,992,318 B2
(45) Date of Patent: Jan. 31, 2006

(54) SEMICONDUCTOR DEVICE HAVING SUPERLATTICE SEMICONDUCTOR LAYER AND METHOD OF MANUFACTURING THE SAME

(75) Inventors: Won-seok Lee, Seoul (KR); Kyoung-ho Ha, Seoul (KR); Joon-seop Kwak, Gyeonggi-do (KR); Ho-sun Paek, Gyeonggi-do (KR); Sung-nam Lee, Gyeonggi-do (KR); Tan Sakong, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/877,982

(22) Filed: Jun. 29, 2004

(65) Prior Publication Data

US 2005/0029506 A1    Feb. 10, 2005

(30) Foreign Application Priority Data

Aug. 4, 2003    (KR) .................... 10-2003-0053889

(51) Int. Cl.
*H01L 33/00* (2006.01)
*H01L 31/0304* (2006.01)

(52) U.S. Cl. .............................. 257/15; 257/13; 257/97
(58) Field of Classification Search ................ 257/15, 257/13, 97
See application file for complete search history.

(56) References Cited

U.S. PATENT DOCUMENTS

| | | | | |
|---|---|---|---|---|
| 4,591,889 A | * | 5/1986 | Gossard et al. ............... | 257/15 |
| 4,594,603 A | * | 6/1986 | Holonyak, Jr. ............... | 257/15 |
| 6,060,335 A | * | 5/2000 | Rennie et al. ................ | 438/46 |
| 6,573,527 B1 | * | 6/2003 | Sugiyama et al. ............ | 257/14 |
| 2001/0030317 A1 | * | 10/2001 | Lee et al. ..................... | 257/13 |

FOREIGN PATENT DOCUMENTS

| | | |
|---|---|---|
| JP | 2001-308458 | 11/2001 |
| JP | 2002-111131 | 4/2002 |

* cited by examiner

*Primary Examiner*—Jerome Jackson
(74) *Attorney, Agent, or Firm*—Buchanan Ingersoll PC

(57) ABSTRACT

Provided are a semiconductor device having a superlattice semiconductor layer and a method of fabricating the same. The semiconductor device includes a superlattice semiconductor layer in which first material layers and second material layers formed of different materials are alternately stacked. A plurality holes are formed in the first material layers and the second material layers forming a superlattice structure, and the holes are filled with materials of the adjacent material layers. The provided superlattice structure reduces a driving voltage by transferring charges through the holes in the first material layers and the second material layers while maintaining a predetermined optical confinement characteristic.

10 Claims, 8 Drawing Sheets

SEMICONDUCTOR DEVICE HAVING SUPERLATTICE SEMICONDUCTOR LAYER AND METHOD OF MANUFACTURING THE SAME

This application claims the priority of Korean Patent Application No. 2003-53889, filed on Aug. 4, 2003, in the Korean Intellectual Property Office, which is incorporated herein in its entirety by reference.

BACKGROUND OF THE INVENTION

1. Field of the Invention

The present invention relates to a semiconductor having a superlattice semiconductor layer and a method of manufacturing the same, and more particularly, to a semiconductor device having a GaN superlattice semiconductor layer for reducing a driving voltage by decreasing a series resistance and a method of manufacturing the same.

2. Description of the Related Art

A laser diode (LD) has a superlattice structure in which different materials are stacked to form a multi-layer. For example, a GaN based LD has a superlattice structure in which AlGaN and GaN are stacked in a sandwich structure as shown in FIG. 1. Such a GaN based LD requires AlGaN having a large amount of Al in order to improve an optical confinement. However, AlGaN having a large amount of Al increases a series resistance of the LD that causes an increase in a driving voltage of the LD. In addition, the increase in the driving voltage of the LD reduces the lifespan of the LD.

A GaN based material is studied to be applied to an optical device field, such as a light emitting diode (LED) and an LD. Decreases in an oscillation current and a driving voltage reduce an input power to an LD, resulting in the improvement of durability. Since Mg as a p-type dopant has a low doping efficiency, an increase in the driving voltage usually occurs in a p-type layer. Referring to the Japanese Laid-open Patent No. 13-308458 and the Japanese Laid-open Patent No. 14-111131, p-type layers in a GaN based LD include a p-GaN optical waveguide layer, a p-AlGaN/GaN optical confinement layer, and a p-GaN contact layer.

An optical confinement layer has a superlattice structure having a GaN layer interposed between AlGaN layers. The GaN layer interposed between the AlGaN layers in the optical confinement layer prevents cracks of the AlGaN layers having a large amount of Al. In addition, the superlattice structure having GaN and AlGaN increases a doping efficiency of a deep acceptor by forming two dimensional hole gas and increases a hole concentration by increasing the doping efficiency as well as generating a higher doping efficiency than a bulk AlGaN layer.

Studies for optimizing the p-type layers to prevent increases in the driving voltage of the GaN based LD take place by varying experimental conditions, for example, changing the thickness of a superlattice and the flows of dopants. However, such a method met the limitation to optimize the superlattice because AlGaN including a large amount of Al should be used for the optical confinement.

Accordingly, the series resistance should be reduced to increase the lifespan of the LD, so the amount of Al should be reduced to reduce the resistance of the superlattice structure. However, since the reduction of the amount of Al deteriorates the optical confinement, there is a limit of reducing the amount of Al.

SUMMARY OF THE INVENTION

The present invention provides a semiconductor device having a superlattice semiconductor layer for reducing a series resistance without decrease in an optical confinement and a method of manufacturing the same.

More specifically, the present invention provides a semiconductor device having a superlattice semiconductor layer with a reduced input power due to a reduced series resistance and an improved durability and a method of manufacturing the same.

According to an aspect of the present invention, there is provided a semiconductor device having a superlattice semiconductor layer in which first material layers and second material layers formed of different materials and having a plurality of holes are alternately stacked, the holes being filled with materials of the adjacent material layers.

According to another aspect of the present invention, there is provided a laser diode (LD) comprising a laser resonance layer, a first semiconductor layer formed at one side of the laser resonance layer, and a second semiconductor layer formed at the other side of the laser resonance layer, wherein the second semiconductor layer includes a superlattice structure in which first layers of a first material and second layers of a second material are stacked, and a plurality of holes are formed in the first layers and the second layers of the superlattice structure and the holes are filled with the second material and the first material, respectively.

According to still another aspect of the present invention, there is provided a method of forming a superlattice semiconductor layer in which first material layers and second material layers formed of different materials are alternately stacked, the method comprising forming a plurality of nano-holes in the first material layers and the second material layers by controlling a pressure when growing the first material layers and the second material layers.

According to still another aspect of the present invention, there is provided a method of fabricating a semiconductor device having a superlattice semiconductor layer in which first material layers and second material layers formed of different materials are alternately stacked, the method comprising forming a plurality of nano-holes in the first material layers and the second material layers by temporarily stopping the supply of a growing material when growing the first material layers and the second material layers.

According to yet still another aspect of the present invention, there is provided a method of fabricating a semiconductor device having a superlattice semiconductor layer in which first material layers and second material layers formed of different materials are alternately stacked, the method comprising forming a plurality of nano-holes in the first material layers and the second material layers by controlling growing speeds of the first material layers and the second material layers.

BRIEF DESCRIPTION OF THE DRAWINGS

The above aspects and advantages of the present invention will become more apparent by describing in detail exemplary embodiments thereof with reference to the attached drawings in which.

DETAILED DESCRIPTION OF THE INVENTION

Figure 1:
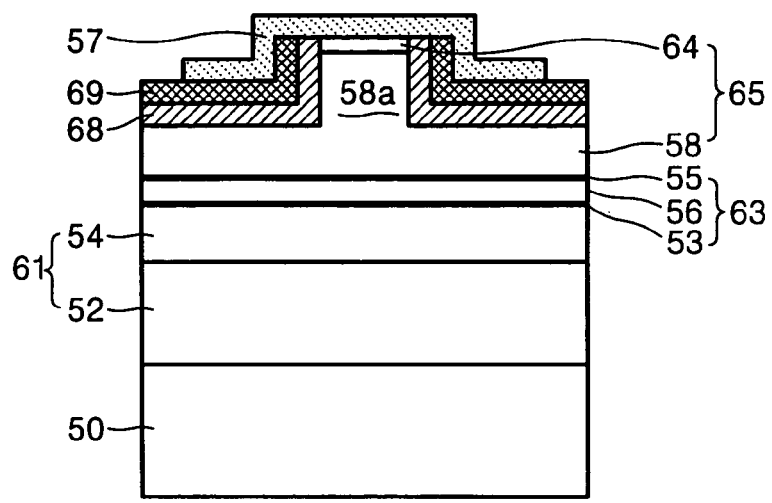
FIG. 1 is a sectional view illustrating a semiconductor device according to the present invention.

The present invention will now be described more fully with reference to the accompanying drawings, in which exemplary embodiments of the invention are shown. In the drawings, the thicknesses of layers and regions are exaggerated for clarity.

FIG. 1 is a sectional view illustrating a semiconductor laser diode (LD) according to the present invention. Referring to FIG. 1, a semiconductor LD according to the present invention includes a substrate 50 and a first semiconductor layer 61, a laser resonance layer 63 and a second semiconductor layer 65, which are grown on the substrate 50.

The first semiconductor layer 61 as a lower material layer includes a buffer layer 52, which is grown on the substrate 50, and a lower cladding layer 54 stacked on the buffer layer 52.

A sapphire substrate or a free-standing gallium nitride (GaN) substrate is used for the substrate 50. The buffer layer 52 is an n-GaN based group III–V nitride compound semiconductor layer, and it is preferable that the buffer layer 52 is an n-GaN layer. However, the buffer layer 52 may be another group III–V compound semiconductor layer that can oscillate laser, in other words, lasing. It is preferable that the lower cladding layer 54 is an n-GaN/AlGaN superlattice structure layer having a predetermined refractive index, but can be formed of another compound that can oscillate laser.

The resonance layer 63 includes a lower wave guide layer 53, an active layer 56, and an upper wave guide layer 55, which are sequentially stacked on the lower cladding layer 54. The upper and lower wave guide layers 55 and 53 are formed of a material having a smaller refractive index than the active layer 56. It is preferable that the upper and lower wave guide layers 55 and 53 are GaN based group III–V compound semiconductor layers. The lower wave guide layer 53 is an n-GaN layer, and the upper wave guide layer 55 is a p-GaN layer. The active layer 56 is formed of a lasing material, preferably a material for oscillating a laser beam which has a small critical current and a stable traverse mode characteristic. The active layer 56 may have a multi-quantum well structure or a single quantum well structure, and the structure of the active layer 56 does not limit the scope of the present invention.

The second semiconductor layer 65 as an upper material layer is stacked on the upper surface of the upper wave guide layer 55. Generally, a ridge 58a is formed on the upper material layer to form a ridge waveguide. Since the ridge structure is widely known, the description of the ridge structure will be omitted.

The second semiconductor layer 65 includes an upper cladding layer 58 having a smaller refractive index than the upper wave guide layer 55, and an ohmic contact layer 64 stacked on the upper surface of the upper cladding layer 58. When the lower cladding layer 54 is an n-type compound semiconductor layer, the upper cladding layer 58 is a p-type compound semiconductor layer. When the lower cladding layer 54 is a p-type compound semiconductor layer, the upper cladding layer 58 is an n-type compound semiconductor layer. In other words, when the lower cladding layer 54 is the n-GaN/AlGaN layer, the upper cladding layer 58 is a p-GaN/AlGaN layer. Similarly, when the buffer layer 52 is an n-type compound semiconductor layer, the ohmic contact layer 64 is a p-type compound semiconductor layer, and when the buffer layer 52 is formed of n-GaN, the ohmic contact layer 64 is formed of p-GaN.

A buried layer 68 as a passivation layer covers upper edges of the upper cladding layer 58 and the ridge 58a protruded at the center of the upper cladding layer 58. A protective layer 69 is formed on the upper surface of the buried layer 68 to cover the buried layer 68. The buried layer 68 is formed of a conventional passivation material, for example, an oxide including at least one element selected from a group formed of Si, Al, Zr, and Ta. On the other hand, the protective layer 69 is formed of a material having excellent etch selectivity and adherence to the passivation material, for example, Cr or $TiO_2$. The protective layer 69 operates as a protective mask when etching the buried layer 68. When the protective layer 69 is formed of a metal having excellent thermal conduction, the heat generated while operating a laser device can be efficiently discharged. A p-type upper electrode 57 is formed on the top of the ridge wave guide structure having the buried layer 68 and the protective layer 69. The central portion of the upper electrode 57 contacts the ohmic contact layer 64 at the top of the ridge 58a, and the edges of the upper electrode 57 extend to the edges of the upper cladding layer 58.

Figure 2:
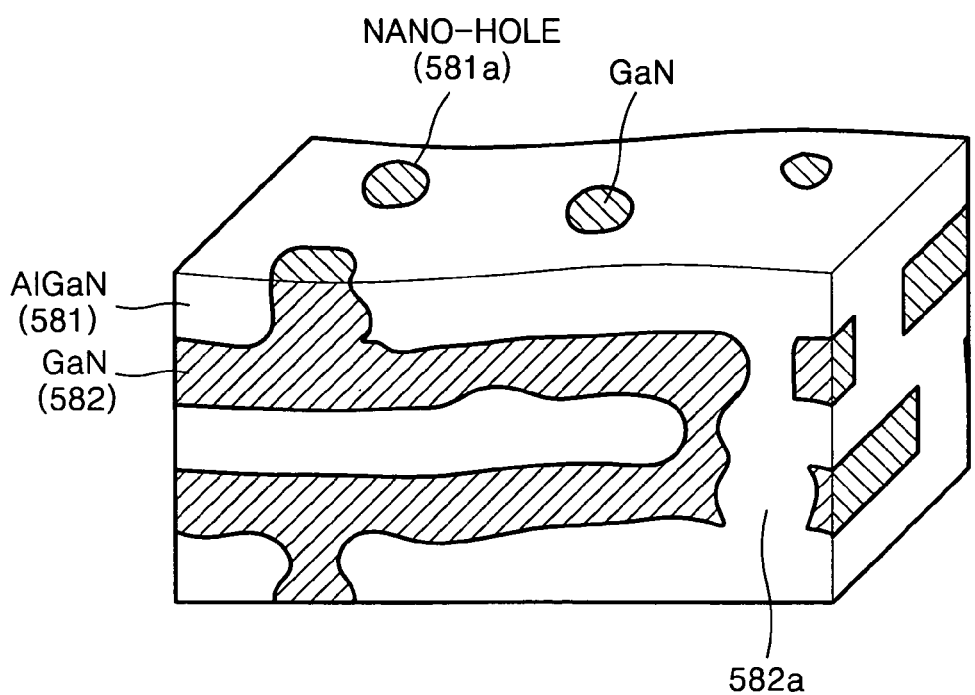
FIG. 2 is a perspective view illustrating a superlattice structure of a semiconductor device according to the present invention.
Figure 3:
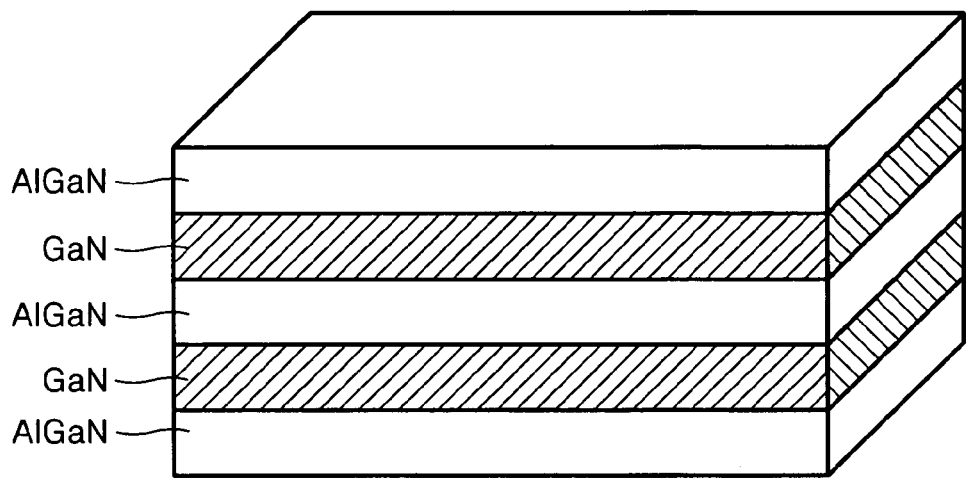
FIG. 3 is a perspective view illustrating a superlattice structure of a conventional semiconductor device.

The structure of a p-GaN/AlGaN cladding layer, which causes the increase in the series resistance, is improved in the LD according to the present invention. FIG. 2 is a perspective view illustrating the stacked structure of the p-cladding layer, and FIG. 3 is a sectional view illustrating the stacked structure of a superlattice layer in a conventional LD.

Referring to FIG. 2, first layers 581 and second layers 582 are alternately stacked and a plurality of holes 581a and 582a are formed in each layer, respectively. For example, a plurality of holes 581a and 582a are formed in the AlGaN first layers 581 and p-doped GaN second layers 582, respectively. The holes 581a and 582a are filled with the materials of the adjacent layers. In other words, the holes 581a of the first layers 581 are filled with the second layer material, and the holes 582a of the second layers 582 are filled with the first layer material. According to the structure, the same material layers that are separated by the structure in which different material layers are alternately stacked are connected through the holes formed between the same material layers. Accordingly, the AlGaN layers having a lower resistance than the GaN second layers 582 are connected to each other, thereby reducing an electric resistance compared to a structure in which AlGaN layers are entirely connected in the superlattice structure.

In the above-described structure, the number of the holes 581a and 582a is large, and the size of the holes 581a and 582a is in a range from nanometers to microns. The present invention is provided to reduce a resistance in a superlattice structure, such as a p-cladding layer, which is realized by forming the holes having a size of microns to nanometers in the material layers. The holes connect the same material layers, resulting in the reduction of the driving voltage of an LD device.

Holes, which are transferred through the nano-holes formed in the superlattice, are not likely transferred through a boundary or a barrier between GaN having a large amount of Al and AlGaN, resulting in the reduction of a series resistance of an LD device. It is proved that a driving voltage is reduced by about 1V when a superlattice having the nano-holes is applied to an LD in an experiment. By reducing the driving voltage, an input power is reduced and the heat from the device is easily discharged, resulting in the increase in the lifespan of the LD.

Characteristic tests are performed on specimens that are manufactured by a conventional method and the present invention to which a superlattice having nano-holes is applied.

Figure 4A:
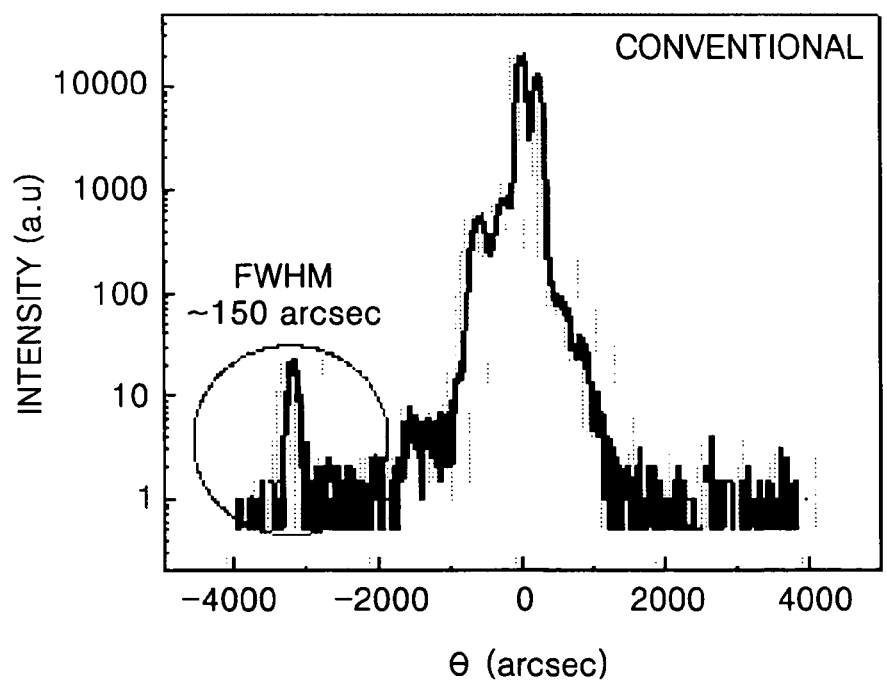
FIGS. 4A and 4B are graphs illustrating results of (002) 2θ-ω scanning on laser diode (LD) specimens to which a conventional superlattice structure of FIG. 3 and a superlattice structure according to the present invention of FIG. 2 are applied.

Referring to FIG. 4A, when AlGaN-$1^{st}$ peak of a conventional AlGaN/GaN superlattice as shown in FIG. 3 is examined by DXRD 2θ-ω scanning, an FWHM value is very sharp at 100 to 250 arcsec. Such an interface operates as a barrier to increase the resistance of a device resulting in the increases in a driving voltage and an input power so that the lifespan of the device is reduced.

Figure 4B:
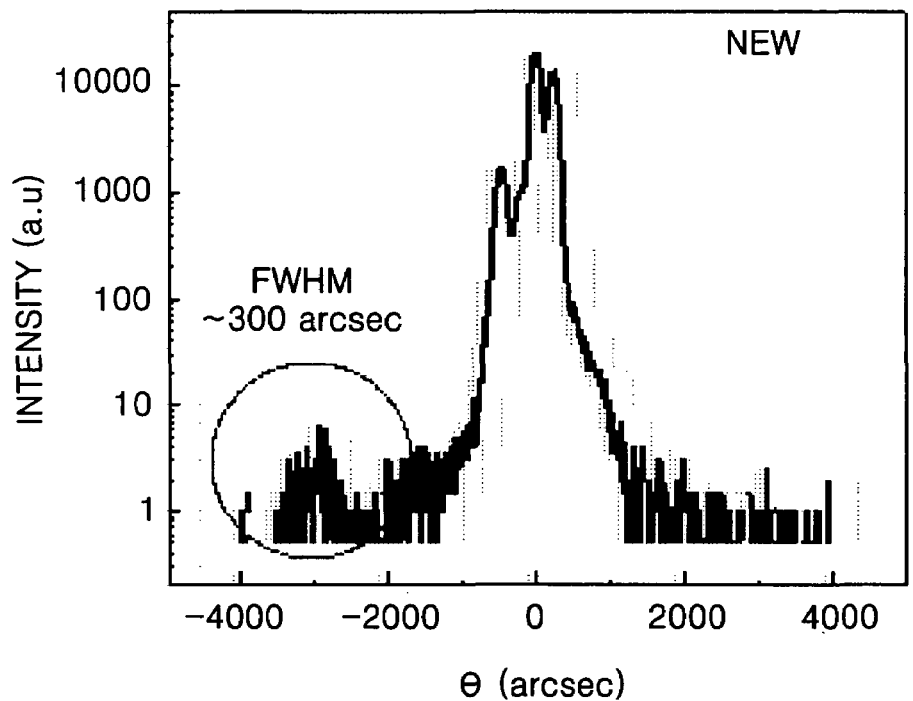

FIGS. 4A and 4B are graphs illustrating (0002) 2θ-ω scanning results of LD specimens to which a conventional superlattice structure and a superlattice according to the present invention are applied, respectively. The graphs of FIGS. 4A and 4B illustrate similar results, particularly, AlGaN $0^{th}$ peaks are the same in the graphs, which means that the compositions of Al included in the LD specimens are the same. Accordingly, it is predicted that the optical confinements of the specimens are the same. However, the intensity and the FWHM of AlGaN-$1^{st}$ peak of the specimen according to the present invention is twice larger than those of the specimen manufactured by the conventional method, which means that the interface between the AlGaN layer and the GaN layer in the superlattice is uneven.

Figure 5:
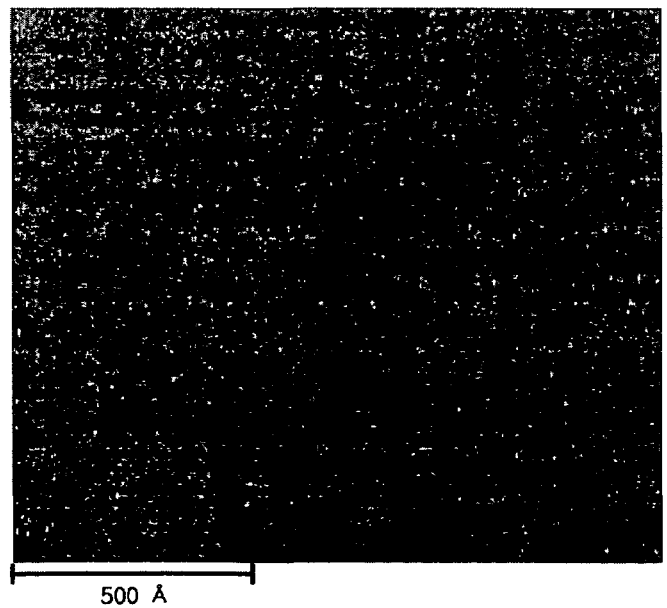
FIG. 5 is a TEM image of an LD specimen having a conventional superlattice structure.
Figure 6A:
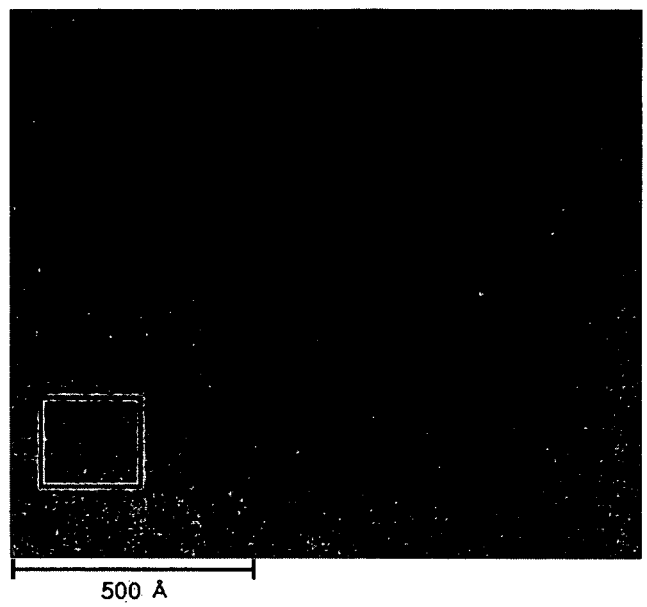
FIG. 6A is a TEM image of an LD specimen having a superlattice structure including nano-holes according to the present invention.

FIG. 5 is a TEM image of a specimen having a conventional superlattice structure. FIG. 6A is a TEM image of a specimen having a superlattice structure including nano-holes according to the present invention, and FIG. 6B is an enlarged image of the square of FIG. 6A.

Figure 6B:
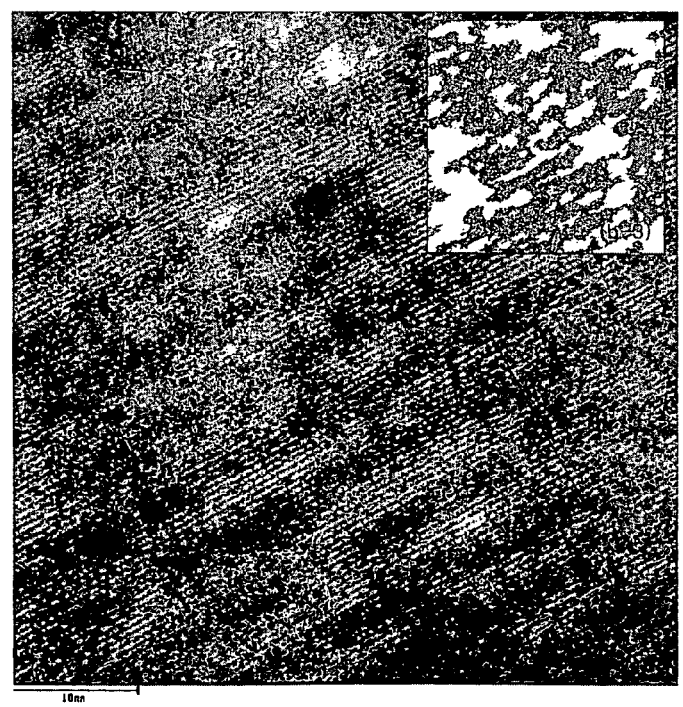
FIG. 6B is an enlarged image of a square of the TEM image shown in FIG. 6A.

Bright potions of the TEM images of FIGS. 5 through 6B denote AlGaN regions, and dark portions of the TEM images of FIGS. 5 through 6B denote GaN regions. In the TEM image of FIG. 5, the interfaces between the AlGaN regions and the GaN regions are clearly divided. However, in the TEM images of FIGS. 6A and 6B, the interfaces between the AlGaN regions and the GaN regions in the superlattice according to the present invention cannot be easily distinguished. Referring to FIG. 6B, nano-holes are formed in interlayer between AlGaN and GaN and interlayer between GaN and AlGaN to vertically connect the same material layers. Arrows in FIG. 6B denotes that the doped GaN regions progress along the nano-holes, which are vertically connected. In the bright square regions (b-3) at the upper right corner of FIG. 6B that denotes the AlGaN regions and the GaN regions, the nano-holes of AlGaN and GaN are vertically formed over a large area.

Accordingly, when the holes are transferred to the active layer, the holes are likely transferred through the nano-holes than through the barriers. Thus, as the number of the nano-holes increases, the series resistance of the LD decreases.

Figure 7A:
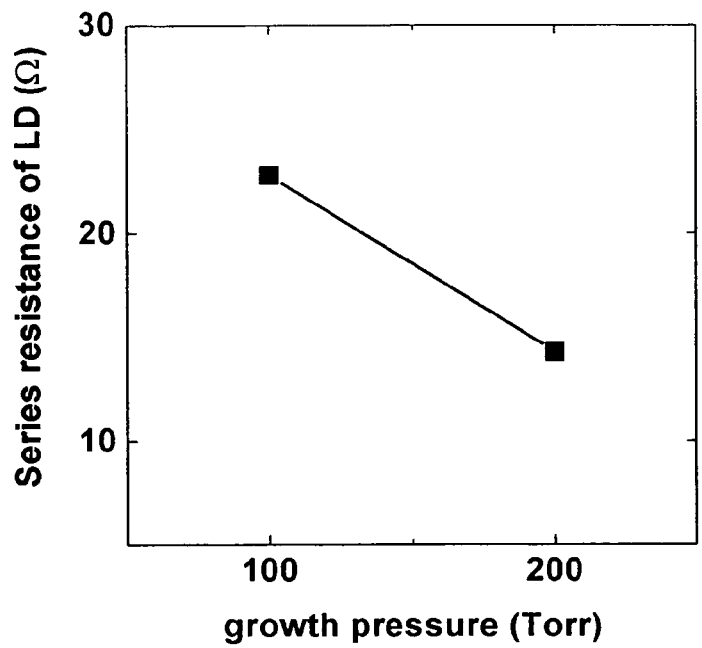
FIGS. 7A and 7B are graphs of series resistances and voltages at 50 mA of LD specimens to which a conventional superlattice structure obtained under a pressure of 100 Torr and a nano-hole superlattice structure obtained under a pressure of 200 Torr according to the present invention are applied, respectively.
Figure 7B:
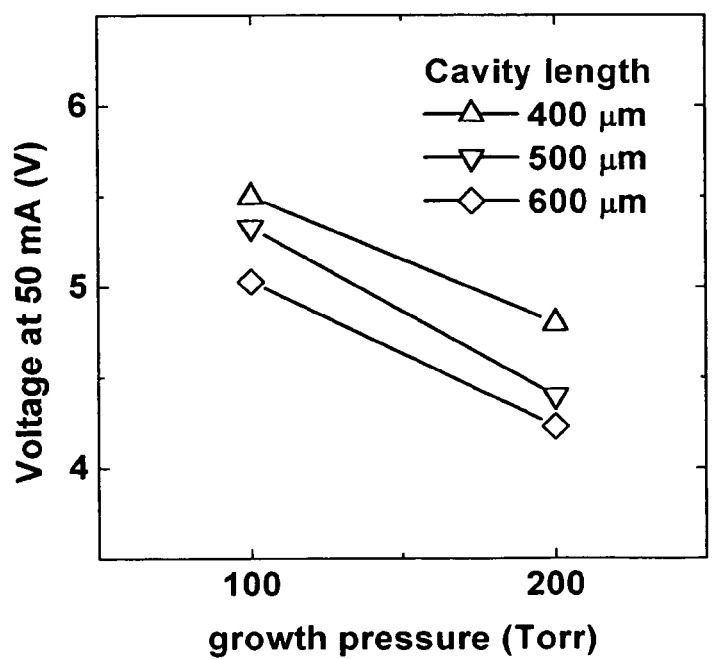

FIGS. 7A and 7B are graphs illustrating the series resistances and the voltages at 50 mA of the specimens to which a conventional superlattice obtained under a pressure of 100 Torr and a nano-hole superlattice obtained under a pressure of 200 Torr are applied. Here, other conditions for manufacturing the specimens are the same except for the pressure. The specimen having the nano-hole superlattice according to the present invention has a series resistance about half of the series resistance of the conventional specimen. As a result, the voltage at 50 mA of the specimen according to the present invention is reduced by about 1V in each cavity length. Accordingly, it is known that the nano-holes can be formed in the superlattice by controlling the pressure when growing the superlattice.

The results of the experiments on the specimens are shown in Table 1. Critical voltages of the specimens are almost the same, because the optical confinements are absent. The input power of the specimen according to the present invention is reduced by about 20% by reducing voltage. Accordingly, the lifespan of the LD device can be improved.

TABLE 1

|  | growth pressure (Torr) | FWHM (arcsec) | Ith (mA, bar test 600 μm) | Rseries (Ω) At 50 mA | Volts (V) at 50 mA |
|---|---|---|---|---|---|
| conventional | 100 | ~150 | 89.3 | 22.8 | 5.03 |
| present invention | 200 | ~300 | 90.0 | 14.3 | 4.23 |

Example of a method of forming the nano-holes in the superlattice according to the present invention will now be described.

First, a growing pressure is increased while growing crystals. When the growing pressure is increased, desorption is increased from a growing layer and incorporation of Al and Ga is reduced, resulting in an uneven growing of a AlGaN layer or a GaN layer at the interface. When the uneven growing is increased, fine hollow areas are formed in the AlGaN layer and the GaN layer in a lateral direction. By stacking the AlGaN layer and the GaN layer continuously, nano-holes, in other words, nano-channels through which the AlGaN layer and the AlGaN layer, and the GaN layer and the GaN layer are connected. It is preferable that the pressure of a reactor is from 150 Torr to a normal pressure, most preferably 150 to 400 Torr.

Second, a growing stop period is provided while growing AlGaN and GaN layers. When growing a superlattice, $NH_3$ and $H_2$ are supplied to a reactor. In this case, by stopping the supplies of Ga and Al, in-situ etching occurs by $H_2$ to partially etch a grown crystal layer, resulting in the formation of nano-holes. The growing stop period is 3 to 50 seconds, preferably, 3 to 15 seconds.

Third, a growing speed is increased not to evenly form each layer that is related with a diffusion time required to obtain an island growth mode. A growing speed range for forming nano-holes is 1 to 10 Å/s, preferably, 2 to 6 Å/s.

A method of forming a superlattice layer while forming nano-holes will now be described.

Figure 8A:
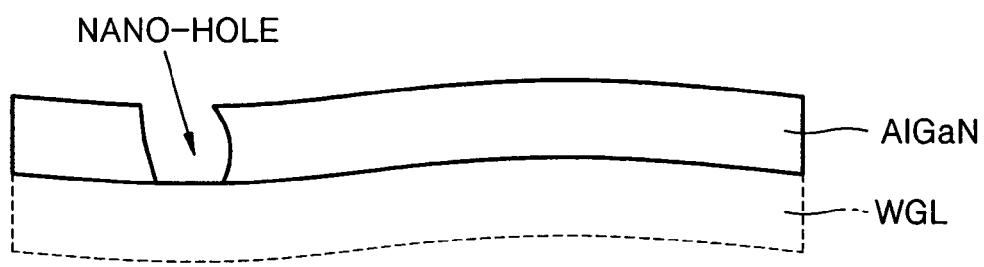
FIGS. 8A through 8D are sectional views of stages in the manufacture of a superlattice structure according to the present invention.

Referring to FIG. 8A, a first material layer (AlGaN) having a plurality of nano-holes is formed on a lower material layer, for example, a p-type wave guide layer 5 (WGL) of an LD. The first material layer (AlGaN) having a plurality of nano-holes is formed by any one method of the above-described methods.

Figure 8B:
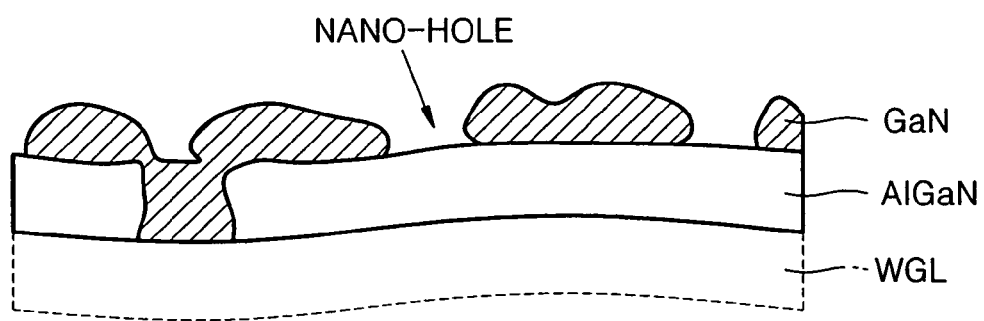

Referring to FIG. 8B, a second material layer (GaN) having nano-holes is formed on the first material layer (AlGaN). Here, the material of the second material layer (GaN) fills the nano-holes of the first material layer (AlGaN).

Figure 8C:
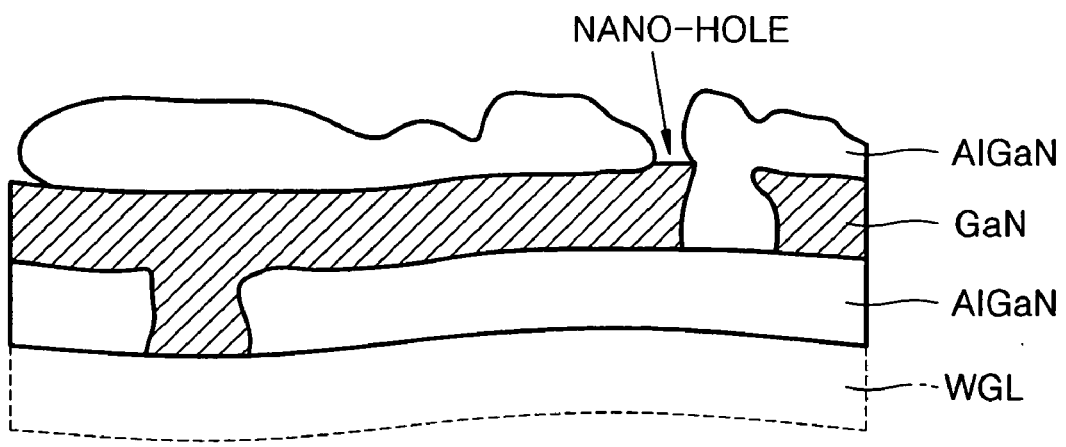

Referring to FIG. 8C, a first material layer (AlGaN) is formed on the second material layer (GaN). Here, the material of the first material layer (AlGaN) fills the nano-holes of the second material layer (GaN).

Figure 8D:
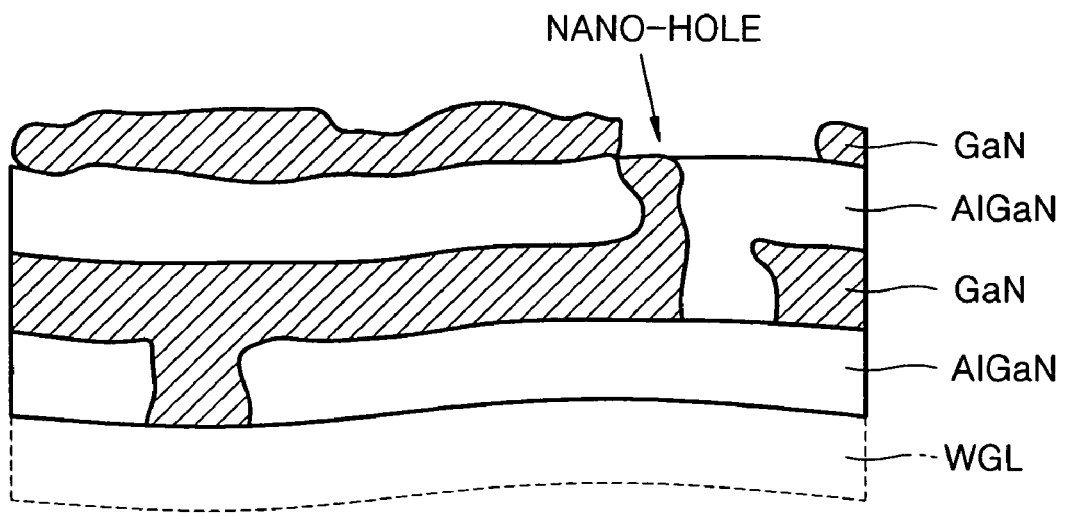

Referring to FIG. 8D, a second material layer (GaN) is formed on the first material layer (AlGaN). Here, the material of the second material layer (GaN) fills the nano-holes of the first material layer (AlGaN).

When the above described processes are repeated for a predetermined number of times, the second material layers on and under the first material layer are connected through the nano-holes formed in the first material layer, resulting in connecting the same material through the layers.

A superlattice according to the present invention can be applied to a cladding layer of an LD, and any superlattice structure requiring an optical confinement and a low series resistance. Since a series resistance increases in a p-type layer of an LD, it is preferable that the superlattice according to the present invention is applied to a p-type structure of the LD. However, the superlattice according to the present invention can be applied to an n-type layer. Since electrons flow through an n-type layer, the electrons can be induced to a resonance layer through the nano-holes while not through a barrier between interfaces having a high resistance. The superlattice according to the present invention can be applied to not only AlGaN/GaN, but also to nitride materials. In other words, the superlattice according to the present invention can be applied to $Al_xIn_yGa_{1-x-y}N/Al_{x'}In_{y'}Ga_{1-x'-y'}N$ where $0 \leq x$, x', y, and y'<1, because the superlattice can reduce a resistance by a barrier due to an energy-band gap. In addition, the superlattice according to the present invention can be applied to regardless of the type of dopants, for example, an n-type, such as Si, or a p-type, such as Mg. Furthermore, doping may be performed on the both sides of $Al_xIn_yGa_{1-x-y}N/Al_{x'}In_{y'}Ga_{1-x'-y'}N$ layer or on any one side of the layer.

Figure 9:
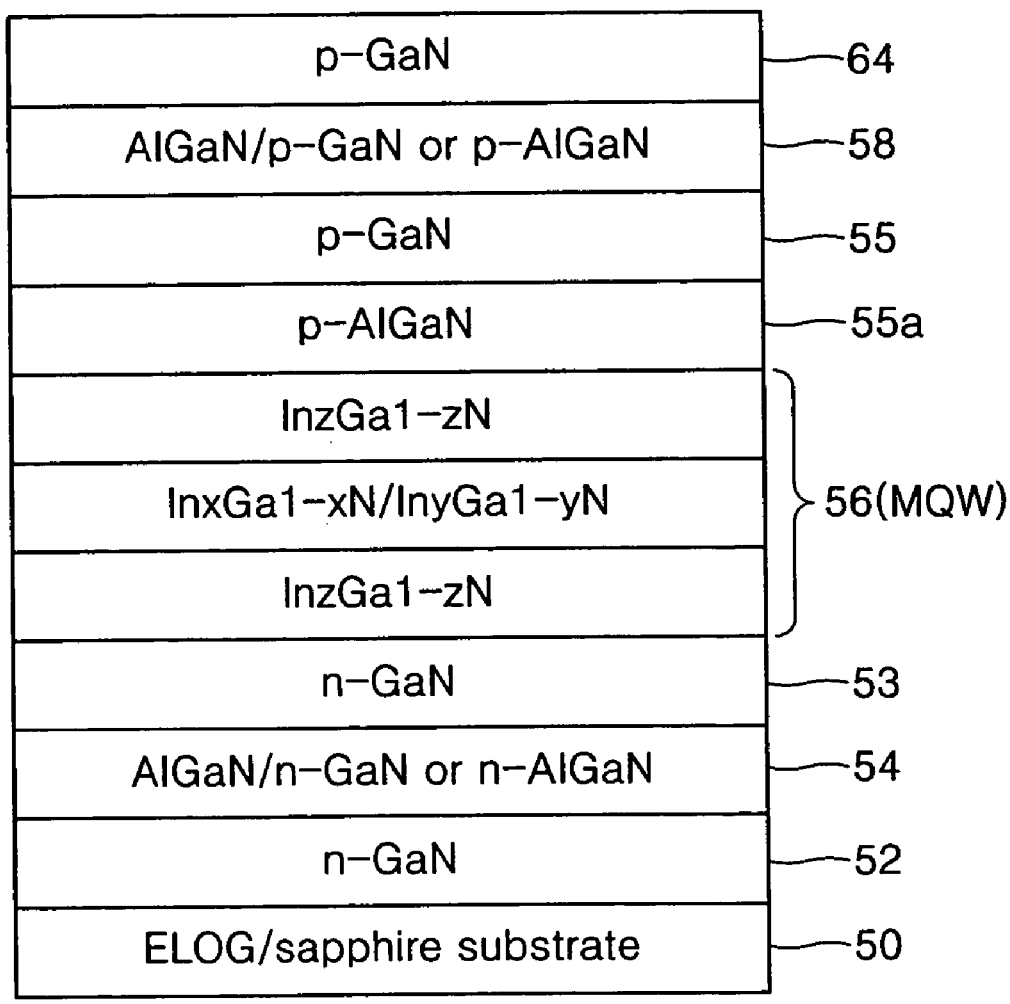
FIG. 9 is a sectional view illustrating an LD according to the present invention.

A method of fabricating an LD shown in FIG. 9 will now be described. FIG. 9 is a sectional view illustrating a resultant structure on which a ridge wave guide is not formed yet. Since growing processes of crystal layers on a substrate are repeated and changes in profiles without an increase in the number of stacked layers do not take place, the method of fabricating an LD is described with reference to FIG. 9.

An n-GaN contact layer 52 is grown on a surface of an ELOG, GaN, or sapphire substrate 50 in MOCVD equipment. Here, the n-GaN contact layer 52 is grown to a thickness of 0.5 μm at a temperature of 1030° C. by using TMG and ammonia as source gases and $SiH_4$ gas as a dopant gas.

An n-cladding layer 54 is formed in a conventional superlattice structure or in a superlattice structure having nano-holes at the same temperature of growing the n-GaN contact layer 52.

An n-GaN wave guide layer 53 is grown to a thickness of 0.1 μm at the same temperature of growing the n-GaN contact layer 52 by using TMG, ammonia, and $SiH_4$ as source gases.

A phase matching layer formed of n-$In_{0.02}Ga_{0.98}N$ is grown to a thickness of 280 Å at a temperature of 870° C. by using TMI, TMG, and ammonia as source gases and $SiH_4$ gas as a dopant gas, and a barrier layer formed of n-$In_{0.02}Ga_{0.98}N$ is formed to a thickness of 100 Å. Accordingly, the phase matching layer formed of the same material as the barrier layer becomes a portion of the barrier layer.

A well layer formed of $In_{0.08}Ga_{0.92}N$ is grown to a thickness of 40 Å by using TMI, TMG, and ammonia as source gases while not supplying $SiH_4$ gas. By repeating the growing of the well layer by three times and growing a barrier layer on the top of the well layers, a multi quantum well (MQW) 56 is formed.

A diffusion barrier layer formed of $In_{0.02}Ga_{0.98}N$ is grown on the MQW 56 to a thickness of 280 Å.

Next, a multi-quantum barrier (MQB) 55a is grown to a thickness of 200 Å by alternately stacking an AlGaN layer and a p-GaN layer at a temperature of 1030° C. and by using TMA, TMG, and ammonia as source gases and $Cp_2Mg$ as a dopant gas.

A p-GaN wave guide layer 55 is formed to a thickness of 0.1 μm by using TMG and ammonia as source gases and $Cp_2Mg$ as a dopant gas.

A p-cladding layer 58 is grown in an AlGaN/p-GaN superlattice structure having nano-holes.

A p-contact layer 64 is grown on the p-cladding layer 58 to a thickness of 300 Å by using TMG, ammonia, and $Cp_2Mg$.

Thereafter, a crystal surface is etched in a resonance direction of a laser and a current path is defined in a passivation layer, resulting in a ridge structure. Then, an n-type electrode is formed on an upper surface of the n-GaN layer, and a p-type electrode is formed on the ridge to manufacture an LD. Thereafter, a flip-chip bonding method for easily discharging heat from a GaN semiconductor LD is performed.

According to the present invention, an LD having an excellent optical confinement characteristic and a low driving voltage can be obtained by efficiently transferring charges through nano-holes while maintaining the optical confinement characteristic in a superlattice structure.

Such an LD can solve the problems of the driving voltage and the optical confinement when growing an AlGaN/GaN superlattice structure. Accordingly, the superlattice structure according to the present invention can be applied to a light emitting device (LED) and an LD. In addition, an input power is reduced when driving a device using the superlattice structure according to the present invention, resulting in the increase in the lifespan of the device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device having a superlattice semiconductor layer in which first material layers and second material layers formed of different materials are alternately stacked, the semiconductor device comprising:
 a superlattice structure formed of the first material layers and the second material layers, the first material layers and the second material layers having a plurality of holes that are respectively filled with materials of adjacent material layers, such that said first material in said holes of said second material layer forms a continuous path of said first material between layers adjacent to said respective surface boundaries of said second material layer, and said second material in said holes of said first material layer forms a continuous path of said second material between layers adjacent to said respective surface boundaries of said first material layer.

2. The semiconductor device of claim 1, wherein the superlattice structure is formed of a p-type semiconductor layer.

3. The semiconductor device of claim 1, wherein the superlattice structure is formed in a GaN/AlGaN structure.

4. The semiconductor device of claim 2, wherein the superlattice structure is formed in a GaN/AlGaN structure.

5. A laser diode (LD) comprising:
   a laser resonance layer;
   a first semiconductor layer formed at one side of the laser resonance layer; and
   a second semiconductor layer formed at the other side of the laser resonance layer, wherein
   the second semiconductor layer includes a superlattice structure in which first layers of a first material and second layers of a second material are stacked, and a plurality of holes are formed in the first layers and the second layers of the superlattice structure and the holes are filled with the second material and the first material, respectively, such that said first material in said holes of said second material layer forms a continuous path of said first material between avers adjacent to said respective surface boundaries of said second material layer, and said second material in said holes of said first material layer forms a continuous path of said second material between layers adjacent to said respective surface boundaries of said first material layer.

6. The LD of claim 5, wherein the first semiconductor layer is an n-GaN based group III–V nitride semiconductor layer.

7. The LD of claim 5, wherein the resonance layer further includes:
   a lower wave guide layer stacked on the first semiconductor layer and having a larger refractive index than a lower cladding layer;
   an active layer stacked on an upper surface of the lower wave guide layer and generating a laser beam; and
   an upper wave guide layer stacked on the active layer.

8. The LD of claim 5, wherein the second semiconductor layer is formed of p-GaN/AlGaN.

9. The semiconductor device of claim 1, wherein said plurality of holes in the first material layer and said second material layer are formed by controlling pressure to over 150 Torr when growing the first material layer and the second material layer, respectively.

10. The semiconductor device of claim 5, wherein said plurality of holes in the first material layer and said second material layer are formed by controlling pressure to over 150 Torr when growing the first material layer and the second material layer, respectively.

* * * * *